US012368067B2

(12) United States Patent
Wang et al.

(10) Patent No.: US 12,368,067 B2
(45) Date of Patent: Jul. 22, 2025

(54) METHOD, APPARATUS, AND SYSTEM FOR DYNAMICALLY CONTROLLING AN ELECTROSTATIC CHUCK DURING AN INSPECTION OF WAFER

(71) Applicant: ASML Netherlands B.V., Veldhoven (NL)

(72) Inventors: Yixiang Wang, Fremont, CA (US); Shibing Liu, San Jose, CA (US); Ying Luo, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 392 days.

(21) Appl. No.: 17/913,149

(22) PCT Filed: Mar. 18, 2021

(86) PCT No.: PCT/EP2021/056890
§ 371 (c)(1),
(2) Date: Sep. 20, 2022

(87) PCT Pub. No.: WO2021/185939
PCT Pub. Date: Sep. 23, 2021

(65) Prior Publication Data
US 2023/0178406 A1    Jun. 8, 2023

Related U.S. Application Data

(60) Provisional application No. 62/992,718, filed on Mar. 20, 2020.

(51) Int. Cl.
*H01L 21/683* (2006.01)
*H01J 37/20* (2006.01)

(52) U.S. Cl.
CPC ........ *H01L 21/6833* (2013.01); *H01J 37/20* (2013.01); *H01J 2237/20285* (2013.01);
(Continued)

(58) Field of Classification Search
CPC ........... H01L 21/6833; H01L 21/67253; H01L 21/67288; H01J 37/20; H01J 2237/20285;
(Continued)

(56) References Cited

U.S. PATENT DOCUMENTS

| 5,179,498 A | * | 1/1993 | Hongoh | ................. H02N 13/00 269/903 |
| 5,535,090 A | * | 7/1996 | Sherman | ............. H01L 21/6833 279/128 |

(Continued)

FOREIGN PATENT DOCUMENTS

| JP | 2008-130361 A | 6/2008 |
| KR | 19980064365 A | 10/1998 |

(Continued)

OTHER PUBLICATIONS

Office Action of the Intellectual Property Office of Taiwan issued in related Taiwanese Patent Application No. 110109688; mailed Apr. 8, 2022 (13 pgs.).

*Primary Examiner* — David A Vanore
(74) *Attorney, Agent, or Firm* — FINNEGAN, HENDERSON, FARABOW, GARRETT & DUNNER LLP (57) ABSTRACT

An electrostatic chuck control system configured to be utilized during an inspection process of a wafer, the electrostatic chuck control system comprising an electrostatic chuck of a stage configured to be undocked during the inspection process, wherein the electrostatic chuck comprises a plurality of components configured to influence an interaction between the wafer and the electrostatic chuck during the inspection process, a first sensor configured to generate measurement data between at least some of the plurality of components and the wafer, and a controller including circuitry configured to receive the measurement data to determine characteristics of the wafer relative to the (Continued)

electrostatic chuck and to generate adjustment data to enable adjusting, while the stage is undocked, at least some of the plurality of components based on the determined characteristics.

20 Claims, 6 Drawing Sheets

(52) U.S. Cl.
CPC ............... *H01J 2237/24592* (2013.01); *H01J 2237/2817* (2013.01)

(58) Field of Classification Search
CPC ..... H01J 2237/24592; H01J 2237/2817; H01J 2237/204
See application file for complete search history.

(56) References Cited

U.S. PATENT DOCUMENTS

| | | | | |
|---|---|---|---|---|
| 5,872,694 | A * | 2/1999 | Hoinkis | H01L 21/6831 361/234 |
| 5,948,986 | A * | 9/1999 | Brown | H01L 21/67288 361/234 |
| 6,603,130 | B1 | 8/2003 | Bisschops | F16C 32/0614 355/72 |
| 6,674,510 | B1 * | 1/2004 | Jasper | G03F 9/7026 355/53 |
| 8,029,973 | B2 * | 10/2011 | De Laat | G03F 7/707 430/271.1 |
| 8,928,860 | B2 * | 1/2015 | Hempenius | G03F 7/70783 355/72 |
| 9,401,297 | B2 * | 7/2016 | Ebizuka | H01J 37/244 |
| 9,601,307 | B2 * | 3/2017 | Kanno | H01J 37/28 |
| 11,398,398 | B2 * | 7/2022 | Halm | H01L 21/68757 |
| 11,508,601 | B2 * | 11/2022 | Ziegenhagen | H01L 21/6833 |
| 12,181,504 | B2 * | 12/2024 | Lee | H01L 21/67242 |
| 2001/0055189 | A1 * | 12/2001 | Hagi | H02N 13/00 361/234 |
| 2004/0233608 | A1 * | 11/2004 | Brcka | H01L 21/6833 361/234 |
| 2006/0126261 | A1 * | 6/2006 | Petrov | H01L 21/6833 361/234 |
| 2006/0238953 | A1 * | 10/2006 | Hanawa | H01L 21/6831 361/234 |
| 2008/0073564 | A1 * | 3/2008 | Mun | H01L 21/67028 250/441.11 |
| 2010/0110603 | A1 * | 5/2010 | LaFontaine | H01L 21/6831 361/234 |
| 2012/0256087 | A1 * | 10/2012 | Kanno | H01J 37/20 361/234 |
| 2015/0331338 | A1 * | 11/2015 | Arlemark | G03F 7/70908 355/72 |
| 2016/0013010 | A1 * | 1/2016 | Kanno | H01J 37/21 250/440.11 |
| 2019/0074161 | A1 * | 3/2019 | Shibazaki | H01L 21/027 |
| 2019/0319555 | A1 * | 10/2019 | Sasaki | H01L 21/6833 |
| 2019/0385884 | A1 * | 12/2019 | Hidaka | H01L 21/67103 |
| 2020/0411356 | A1 * | 12/2020 | Fujii | H02N 13/00 |
| 2022/0277926 | A1 * | 9/2022 | Wang | H01J 37/3174 |
| 2022/0390855 | A1 * | 12/2022 | Brouwer | G03F 7/705 |
| 2023/0178406 | A1 * | 6/2023 | Wang | H01J 37/20 250/442.11 |

FOREIGN PATENT DOCUMENTS

| | | |
|---|---|---|
| KR | 19990063358 A | 7/1999 |
| KR | 2011/0024474 A | 3/2011 |
| KR | 20140002059 A | 1/2014 |
| TW | 200847321 A | 12/2008 |
| TW | 201021149 A | 6/2010 |
| TW | 201250789 A | 12/2012 |
| TW | I582897 B | 5/2017 |
| TW | 201803004 A | 1/2018 |
| TW | I635563 B | 9/2018 |
| TW | 201931419 A | 8/2019 |
| TW | 201947702 A | 12/2019 |
| WO | WO 99/00889 A1 | 1/1999 |
| WO | WO 2019/155519 A1 | 8/2019 |
| WO | WO 2020/003746 A1 | 1/2020 |
| WO | WO 2021/185939 | 9/2021 |

* cited by examiner

METHOD, APPARATUS, AND SYSTEM FOR DYNAMICALLY CONTROLLING AN ELECTROSTATIC CHUCK DURING AN INSPECTION OF WAFER

CROSS-REFERENCE TO RELATED APPLICATIONS

This application claims priority to International Application No. PCT/EP2021/056890, filed Mar. 18, 2021, and published as WO 2021/185939 A1, which claims priority of U.S. application 62/992,718 which was filed on Mar. 20, 2020. The contents of these applications are incorporated herein by reference in their entireties.

FIELD

The description herein relates to the field of charged particle beam apparatus, and more particularly to a dynamically controlled electrostatic chuck.

BACKGROUND

A charged particle beam apparatus is able to produce a 2-dimensional image of a wafer substrate by detecting secondary electrons, backscattered electrons, mirror electrons, or other kinds of electrons from the surface of the wafer substrate upon impingement by a charged particle beam generated by the charged particle beam apparatus. Various charged particle beam apparatuses are used on semiconductor wafers in semiconductor industry for various purposes such as wafer processing (e.g., e-beam direct write lithography system), process monitoring (e.g., critical dimension scanning electron microscope (CD-SEM)), wafer inspection (e.g., e-beam inspection system), defect analysis (e.g., defect review SEM, or say DR-SEM and Focused Ion Beam system, or say FIB), etc. During the wafer inspection, a wafer is placed on an electrostatic chuck (e-chuck). Placing a wafer on the e-chuck can generate an attracting force between a plurality of electrodes implemented in the e-chuck and the wafer. The attraction between the e-chuck and the wafer can be achieved by applying high voltages to the plurality of electrodes to attract and secure the charged wafer. Moreover, the e-chuck may ground the wafer by using a pin implemented in the e-chuck, which may bias the wafer to a predefined voltage level. However, the e-chuck's ability to perform the above functions may be limited by the e-chuck's position.

SUMMARY

The embodiments of the present disclosure provide a multi-beam inspection apparatus, and more particularly a single-beam or multi-beam inspection system including an improved electrostatic chuck control system. In some embodiments, the inspection system includes an electrostatic chuck comprising a plurality of electrodes, the plurality of electrodes configured to influence an interaction between a wafer and the electrostatic chuck, a first sensor configured to make measurements between the plurality of electrodes and the wafer, a driver configured to capture the measurements from the first sensor and apply voltages to the plurality of electrodes, and a controller configured to receive the captured measurements from the driver to determine whether the wafer is warped during inspection of the wafer and adjust the voltage applying to the plurality of electrodes based on the determination.

In some embodiments, a method for dynamically adjusting parameters of an electrostatic chuck control system for a wafer inspection is provided. The method includes receiving a measured capacitance between a plurality of electrodes in an electrostatic chuck and a wafer from a first sensor to determine a bow of the wafer, wherein the plurality of electrodes is configured to influence an interaction between the wafer and the electrostatic chuck when supplied with a high voltage and providing a first controlling signal to an electrostatic chuck control system configured to control the electrostatic chuck to adjust the high voltage supplied to the plurality of electrodes based on the determination during an inspection of the wafer.

In some embodiments, a non-transitory computer-readable medium storing instructions to execute a method by a processor to cause the apparatus to perform a method to dynamically adjust parameters during a wafer inspection is provided. The method includes receiving a measured capacitance between a plurality of electrodes in an electrostatic chuck and a wafer from a first sensor to determine a bow of the wafer, wherein the plurality of electrodes is configured to influence an interaction between the wafer and the electrostatic chuck when supplied with a high voltage and providing a first controlling signal to an electrostatic chuck control system configured to control the electrostatic chuck to adjust the high voltage supplied to the plurality of electrodes based on the determination during an inspection of the wafer.

DETAILED DESCRIPTION

Reference will now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $\frac{1}{1000}$th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

The working principle of a SEM is similar to a camera. A camera takes a picture by receiving and recording brightness and colors of light reflected or emitted from people or objects. A SEM takes a "picture" by receiving and recording energies of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate images of the structures of the wafer with a higher efficiency and a faster speed.

Typically, the structures are made on a substrate (e.g., a silicon substrate) that is placed on a platform, referred to as a stage, for imaging. The stage holds and moves the wafer and further includes an electrostatic chuck (e-chuck) to secure the wafer to the stage. Some e-chucks have three major functions: clamping the wafer to the stage, detecting the wafer through a capacitance measurement between the e-chuck and the wafer, and grounding the wafer to high voltage.

To perform these functions, the e-chuck can be connected to a contact tower, which provides power to the e-chuck. In some conventional systems, the e-chuck is connected to the contact tower only while the stage is in a loading position for loading the wafer. So when the stage moves from the loading position, the e-chuck disconnects from the contact tower, thereby preventing the e-chuck from having the power needed to perform its functions. As a result, a SEM may have difficulty detecting and responding to problems arising from interactions between the e-chuck and the wafer during the inspection.

To overcome these issues, some conventional systems have a permanent connection between the e-chuck and a power supply. But this type of connection can lead to the e-chuck being damaged during the inspection process as arcing between the e-chuck and wafer may occur due to a large voltage difference between the e-chuck and the wafer. For example, arcing could occur when the wafer is connected to a high voltage (e.g., 30 kV) during the inspection and the e-chuck is supplied with a lower voltage (e.g., 1 kV).

Some embodiments of the present disclosure provide improved circuitry for controlling power supplied to the e-chuck during inspection of wafer. The circuitry may comprise an amplifier that can adjust a voltage(s) from the high-voltage supplier and provide the adjusted voltage(s) to the e-chuck. Since the e-chuck is provided with high-voltage, the voltage difference between the e-chuck and the wafer is low, thereby reducing the risk of arcing.

The circuitry can also be configured to receive signals from a controller. The controller can be configured to check measurements (e.g., a clamping voltage, a capacitance between the e-chuck and the wafer, grounding resistance between two pins implemented in the e-chuck) and make adjustments by providing signals to the circuitry. For example, based on received measurements, if the controller determines that the clamping voltage has dropped below a predefined threshold, it may report an error or try to increase the clamping voltage by providing signals to the circuitry. By way of further example, based on received measurements, the controller may determine that bowing of the wafer may be occurring (resulting in a warped wafer) and may adjust certain clamping voltages to minimize bowing. Moreover, based on received measurements indicating that the wafer may not be well grounded, the controller may provide signals to the circuitry to cause the wafer to be connected to high-voltage. By dynamically adjusting parameters of the circuitry, SEMs can detect potential problems and make adjustments in real-time, thus significantly improving the reliability of the SEMs.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Figure 1:
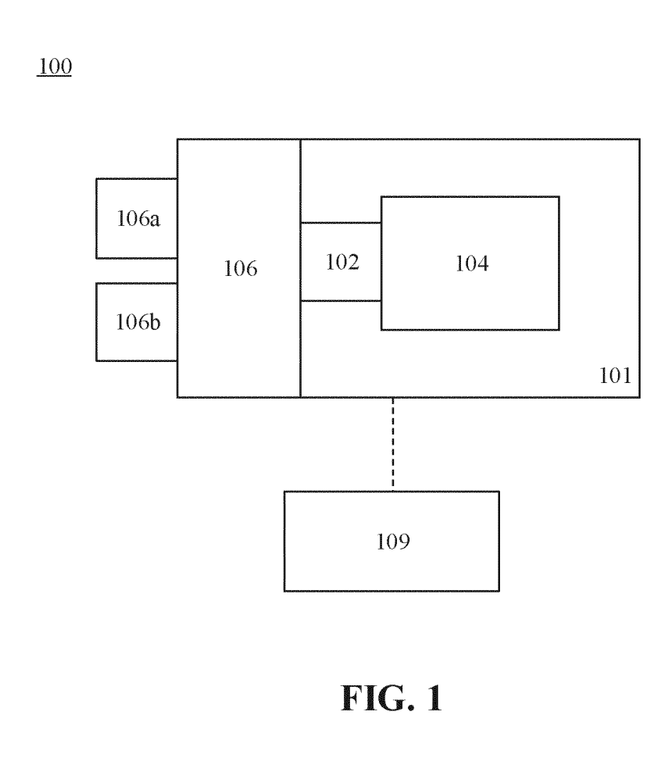
FIG. 1 is a schematic diagram illustrating an example electron beam inspection (EBI) system, consistent with embodiments of the present disclosure.

FIG. 1 illustrates an example electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port (s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
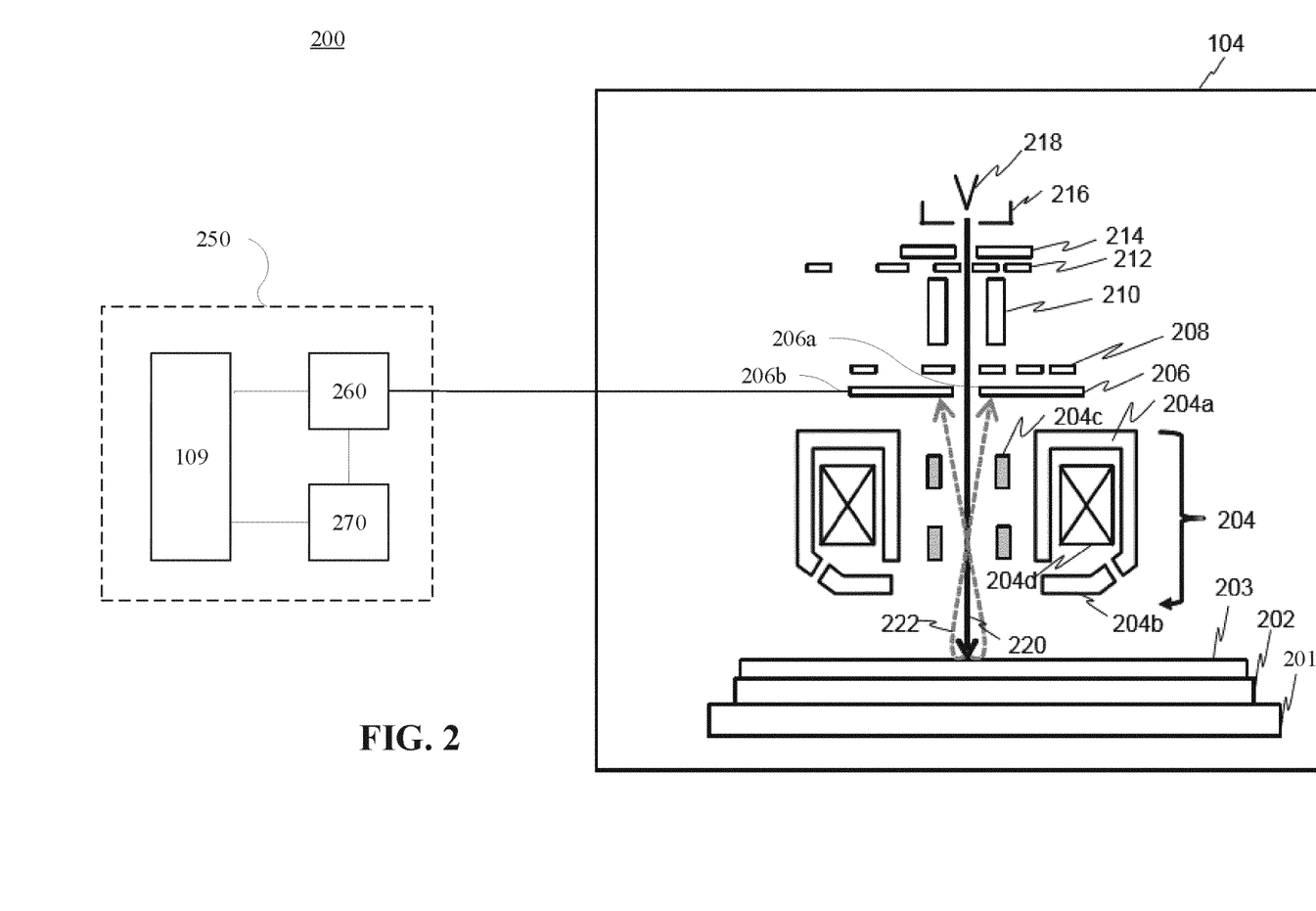
FIG. 2 is a schematic diagram illustrating an example electron beam tool, consistent with embodiments of the present disclosure that may be a part of the example electron beam inspection system of FIG. 1.

FIG. 2 illustrates an example imaging system 200 according to embodiments of the present disclosure. Electron beam tool 104 of FIG. 2 may be configured for use in EBI system 100. Electron beam tool 104 may be a single beam apparatus or a multi-beam apparatus. As shown in FIG. 2, electron beam tool 104 includes a motorized sample stage 201, and a wafer holder 202 supported by motorized sample stage 201 to hold a wafer 203 to be inspected. Electron beam tool 104 further includes an objective lens assembly 204, an electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in some embodiments, may include a modified swing objective retarding immersion lens (SORIL), which includes a pole piece 204a, a control electrode 204b, a deflector 204c, and an exciting coil 204d. Electron beam tool 104 may additionally include an Energy Dispersive X-ray Spectrometer (EDS) detector (not shown) to characterize the materials on wafer 203.

A primary electron beam 220 is emitted from cathode 218 by applying an acceleration voltage between anode 216 and cathode 218. Primary electron beam 220 passes through gun aperture 214 and beam limit aperture 212, both of which may determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c may be controlled to deflect primary electron beam 220 sequentially onto different locations of top surface of wafer 203 at different time points, to provide data for image reconstruction for different parts of wafer 203. Moreover, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may generate multiple primary electron beams 220, and electron beam tool 104 may include a plurality of deflectors 204c to project the multiple primary electron beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary electron beam 220 may be immersed in the magnetic field and may be electrically charged, which, in turn, creates an electric field. The electric field reduces the energy of impinging primary electron beam 220 near the surface of wafer 203 before it collides with wafer 203. Control electrode 204b, being electrically isolated from pole piece 204a, controls an electric field on wafer 203 to prevent micro-arching of wafer 203 and to ensure proper beam focus.

A secondary electron beam 222 may be emitted from the part of wafer 203 upon receiving primary electron beam 220. Secondary electron beam 222 may form a beam spot on sensor surfaces 206a and 206b of electron detector 206. Electron detector 206 may generate a signal (e.g., a voltage, a current, or the like.) that represents an intensity of the beam spot and provide the signal to an image processing system 250. The intensity of secondary electron beam 222, and the resultant beam spot, may vary according to the external or internal structure of wafer 203. Moreover, as discussed above, primary electron beam 220 may be projected onto different locations of the top surface of the wafer or different sides of the wafer at a particular location, to generate secondary electron beams 222 (and the resultant beam spot) of different intensities. Therefore, by mapping the intensities of the beam spots with the locations of wafer 203, the processing system may reconstruct an image that reflects the internal or surface structures of wafer 203.

Imaging system 200 may be used for inspecting a wafer 203 on motorized sample stage 201 and includes an electron beam tool 104, as discussed above. Imaging system 200 may also include an image processing system 250 that includes an image acquirer 260, storage 270, and controller 109. Image acquirer 260 may include one or more processors. For example, image acquirer 260 may include a computer, server, mainframe host, terminals, personal computer, any kind of mobile computing devices, and the like, or a combination thereof. Image acquirer 260 may connect with a detector 206 of electron beam tool 104 through a medium such as an electrical conductor, optical fiber cable, portable storage media, IR, Bluetooth, internet, wireless network, wireless radio, or a combination thereof. Image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may perform adjustments of brightness and contrast, or the like. of acquired images. Storage 270 may be a storage medium such as a hard disk, cloud storage, random access memory (RAM), other types of computer readable memory, and the like. Storage 270 may be coupled with image acquirer 260 and may be used for saving scanned raw image data as original images, and post-processed images. Image acquirer 260 and storage 270 may be connected to controller 109. In some embodiments, image acquirer 260, storage 270, and controller 109 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image including a plurality of imaging areas. The single image may be stored in storage 270. The single image may be an original image that may be divided into a plurality of regions. Each of the regions may include one imaging area containing a feature of wafer 203.

An interaction between wafer holder 202 and wafer 203 may cause some problems. For example, a charge may build up between wafer 203 and wafer holder 202, thereby making it more difficult to remove wafer 203 from the wafer holder 202 and delaying throughput. By way of further example, a wafer 203 that has been warped may cause problems not only with generating accurate images but also extracting wafer 203 from wafer holder 202, thereby slowing a throughput of EBI system. A system described in FIG. 3 may detect such problems and make adjustments in real-time during an inspection of wafer 203.

Figure 3:
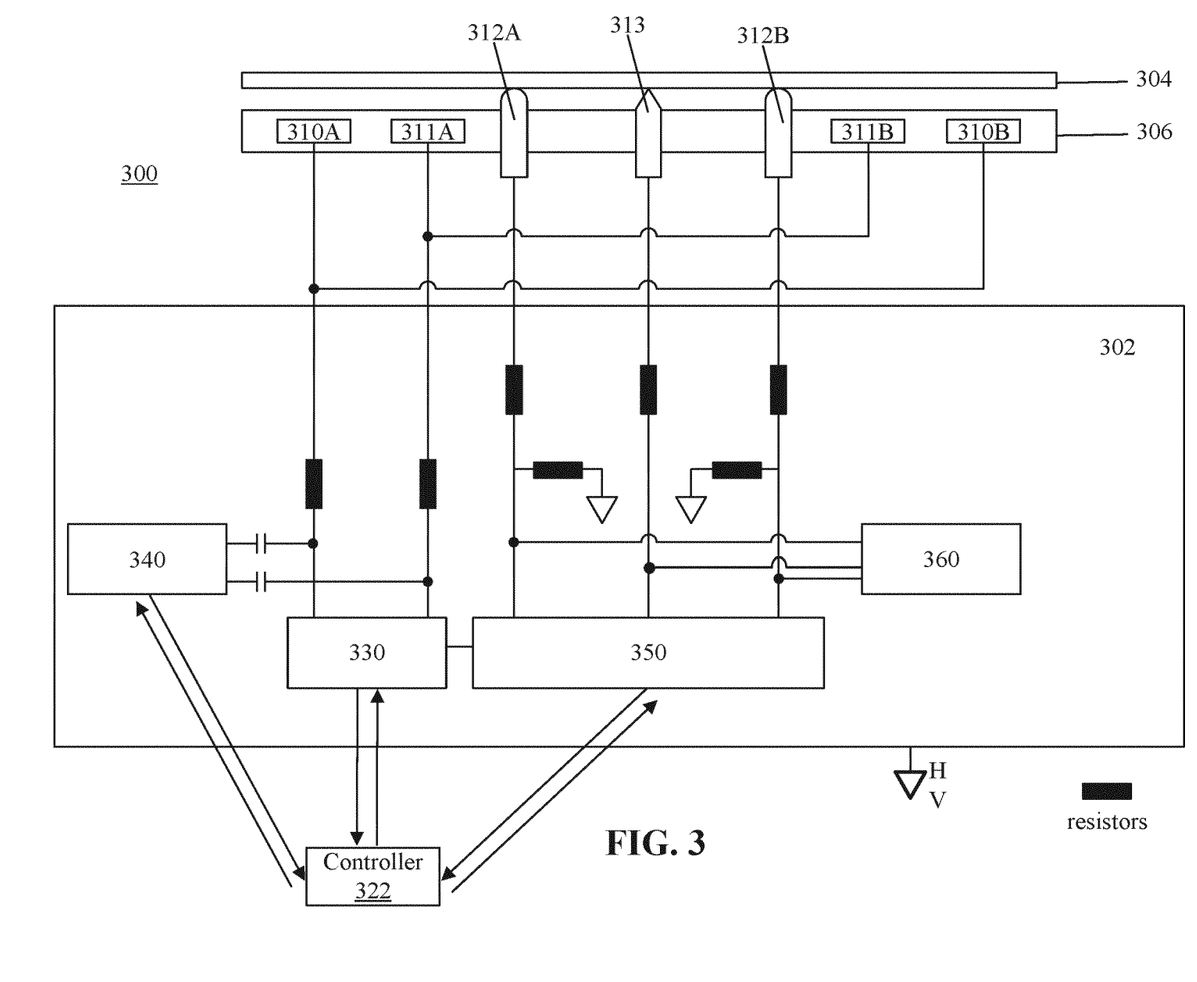
FIG. 3 is an illustration of an exemplary system for detecting potential problems associated with interfaces between a wafer and an electrostatic chuck and make adjustments in real-time during an inspection of the wafer, consistent with embodiments of the present disclosure.

FIG. 3 is an illustration of an exemplary system 300 for controlling an electrostatic chuck (e-chuck) that operates on a high voltage during an inspection process, consistent with embodiments of the present disclosure. System 300 may include an e-chuck control system 302, an e-chuck 306 for holding a wafer 304, and a controller 322.

In some embodiments, wafer 304 may be wafer 203 in FIG. 2, and e-chuck 306 may be wafer holder 202 in FIG. 2. Wafer 304 may include a backside film. The backside film may include thin layers of dielectric or other protective materials such as silicon dioxide or nitride.

To carry out the functions of wafer clamping, wafer detection, and wafer grounding, e-chuck control system 302 may include e-chuck driver 330 for generating signal(s) to adjust high voltage(s) supplied to electrodes 310A-B and 311A-B. Electrodes 310A-B and 311A-B, when electrified, may attract and secure wafer 304 to e-chuck 306 via an electrostatic field. The electrostatic field may enable capacitive coupling between e-chuck 306 and wafer 304 to electrically connect e-chuck 306 and wafer 304. For example, positively charged e-chuck 306 may attract negatively charged wafer 304, and negatively charged e-chuck 306 may attract positively charged wafer 304. A high-voltage supplier may provide voltage(s) to e-chuck control system 302, in which e-chuck driver 330 may adjust the supplied voltage(s) to feed the plurality of electrodes 310A-B and 311A-B implemented in e-chuck 306. For example, e-chuck driver 330 may function as a high-voltage amplifier that may adjust a voltage supplied by a high-voltage supplier and deliver the adjusted voltage(s) to electrodes 310A-B and 311A-B upon receiving an adjustment configuration from controller 322.

In some embodiments, the areas of electrodes 310A-B and 311A-B that are used to contact wafer 304 may be the same. A polarity of voltage for electrodes 310A-B and electrodes 311A-B can be the same or opposite, wherein the polarity of voltage of electrodes 310A-B and electrodes 311A-B can be same when, e.g., wafer 304 is grounded. Electrodes 310A-B and 311A-B may also function as capacitors providing information on capacitance of wafer 306.

E-chuck driver 330 may also generate signals to configure grounding pin 313 to ground wafer 304 via pins 312A,312B, or 313, wherein e-chuck driver 330 is electrically connected to pin 313 (connection not depicted). Pins 312A-B and 313 may be electrically connected between a grounding pulse generator 360 and wafer 304. In some embodiments, grounding pin 313 (or high-voltage pin) may be pressed against a backside film of wafer 304 without completely penetrating the backside film to bias wafer 304 to a predefined level, and pins 312A-B may touch the backside film.

As shown in FIG. 3, e-chuck control system 302 may include capacitance measurement sensor 340 and grounding resistance measurement sensor 350. While FIG. 3 shows that sensors 340 and 350 are internal to e-chuck control system 302, it is appreciated that sensors 340 and 350 may be external to e-chuck control system 302. Capacitance measurement sensor 340 and grounding resistance measurement sensor 350 may detect or measure an electric characteristic associated with interfaces between wafer 304 and e-chuck 306 and provide the measured characteristic to controller 322. For example, electric characteristics may include at least one of an impedance, a resistance, a capacitive reactance, an admittance, a conductance, or a capacitive susceptance. Capacitance measurement sensor 340 may measure a capacitance between e-chuck 306 and wafer 304 and provide measurement signals (representing the measured characteristics/values or indications associated with the measured characteristics/values) to controller 322, which can determine from these measurement signals whether wafer 304 sits properly or not on e-chuck 306. Electrodes 310A-B and 311A-B may function as capacitors providing information on capacitance of wafer 306. If the measured capacitance between electrodes 310A-B and 311A-B is out of a predefined range, controller 322 may determine that wafer is not well placed on e-chuck 306. For example, the capacitance between e-chuck 306 and wafer 304 can be monitored by monitoring a current flowing between any of electrodes 310A-B or 311A-B, or pins 312A-B or 313 as in response to an A/C voltage applied to one or more of these electrodes or pins. A change in the measured current above a predefined threshold may indicate that wafer 304 has bowed.

Grounding resistance measurement sensor 350 may be electrically connected to a pin 312A or 312B. A grounding signal, which may be, for example, a voltage pulse or set of pulses intended to punch through a protective coating of wafer 304, transmitted from grounding pulse generator 360, may enter wafer 304 through pin 313 and exit through pin 312A or 312B. Grounding resistance measurement sensor 350 may measure electric characteristics of a first electric breakdown and a second electric breakdown and provide the measurements to controller 322, the first electric breakdown being between pin 313 and wafer 304 through a backside film of wafer 304, and the second electric breakdown being between wafer 304 and pin 312A or 312B through the backside film. In some embodiments, a capacitive coupling may be formed between wafer 304 and a conductor (e.g., e-chuck 306 or electrodes 310A-B or 311A-B) on a wafer stage. For example, wafer 304 and a conductor on a wafer stage may form a capacitor. The capacitive coupling may be used as an electric path ("return path") for a grounding signal. The electric connectivity of the capacitive coupling may be checked using an alternate current (AC) signal that enters through pin 313. When the AC signal flows through and forms an electric current loop, sensor 350 may transmit signals indicating the electric current loop to controller 322 and controller 322 may determine that the capacitive coupling has been established. In some embodiments, the quality of the electric connection between pin 313 and wafer 304 may be verified by measuring the AC signal. In some embodiments, grounding resistance measurement sensor 350 may measure a voltage between pins 313 and either or 312A or 312B which can be used to evaluate a level of grounding. When a resistance between pin 313 and either pin 312A or 312B is below a predetermined threshold level, the wafer can be considered adequately grounded. For example, the voltage between e-chuck 306 and wafer 304 can be monitored by monitoring a current flowing between any of electrodes 310A-B or 311A-B, or pins 312A-B or 313 as in response to an A/C voltage applied to one or more of these electrodes or pins. A change in the measured current below a predefined threshold may indicate that wafer 304 is adequately grounded.

In some embodiments, e-chuck driver 330 can be configured to receive measurements from capacitance measurement sensor 340 and grounding resistance sensor 350, transfer the received measurements to controller 322, and receive data (communications) from controller 322. For example, if e-chuck control system 302 includes capacitance measurement sensor 340 and grounding resistance measurement sensor 350, then e-chuck driver 330 may receive measurement signals from sensors 340 and 350 and provide measurement signals (representing measured values or indications associated with the measured values) to controller 322. It is appreciated that this is just one example of a configuration, and that any number of other configurations are possible.

Controller 322 may be electrically connected to e-chuck control system 302 and may control e-chuck control system 302 to generate signals. In some embodiments, controller 322 may be implemented as part of controller 109 in FIGS. 1-2. In some embodiments, controller 322 may be implemented as a controller independent from controller 109, such as a software module or a hardware module.

Controller 322 may provide instructions (or control parameters) to configure signals provided by e-chuck driver 330. The signals may include at least one of a voltage, a current, a profile of the voltage or the current, a frequency of the profile, a period of the profile, a phase of the profile, an amplitude of the profile, or a duration of the voltage or the current. The configured signals may enable e-chuck control system 302 to adjust voltage(s) provided to electrodes 310A-B and 311A-B and to ground wafer 304 by using pin 313 during an inspection of wafer 304. Controller 322 may be a real-time controller that may read measurements (e.g., a clamping voltage, a capacitance between e-chuck 306 and wafer 304, a grounding resistance between two grounding pins 313 and either of 312A-B) received from sensors 340 and 350 and make appropriate adjustments. For example, if controller 322 detects that wafer clamping voltage has dropped below a predefined threshold based on measurements provided by sensor 340, controller 322 may provide controlling signals to e-chuck control system 302 (or e-chuck driver 330) to adjust voltage(s) applied to electrodes 310A-B and 311A-B to assist with clamping. The drop of wafer clamping voltage may cause severe problems during an inspection of wafer 304. For example, wafer 304 may detach from e-chuck 306 when a motorized stage (e.g., motorized sample stage 201 comprising e-chuck 306) is moving, thereby damaging wafer and adding problematic debris into the inspection environment. In another example, if controller 322 detects that an attraction between wafer 302 and e-chuck 306 weakens based on capacitance measurements from sensor 340, controller 322 may provide controlling signals to e-chuck control system 302 (or e-chuck driver 330) to apply voltage(s) on electrodes 310A-B and 311A-B to increase the clamping voltage. Sensor 340 may detect that some portions of wafer 304 may not adequately be touching e-chuck 306 that wafer 304.

Controller 322 may also detect whether wafer 304 is bowed or warped through a capacitive value change (e.g., through electrodes 310A-B and 311A-B). For example, controller 322 may determine that the capacitive measurements via electrodes 310A-B are not the same as the capacitive measurements via electrodes 311A-B, which may indicate wafer 304 is warped or bowed in some manner. If it is determined that the capacitive measurements indicate wafer bowing or warping, controller 322 can instruct e-chuck control system 302 to adjust applied voltage(s) to electrodes 310A-B and 311A-B to increase a clamping voltage via control signals.

Controller 322 may also provide signals to ground wafer 304 if controller 322 finds that wafer 304 is not well connected to a high voltage (such as a decrease in grounding resistance) based on grounding resistance measurements from sensor 350. Controller 322 may determine to provide the grounding signals. The grounding determination may comprise: 1) enabling grounding pulse generator 360, which is configured to provide a serial of high voltage pulses to pin 313, pin 312A, or pin 312B such that dielectric breakdown occurring at backside films of wafer 304 forms a current path through the backside film and another pin such as pin 313, 2) measuring, by sensor 350, a voltage between any of pins 313, 312A, or 312B, and 3) comparing, by controller 322, the measured voltage against a predefined voltage. Thus, controller 322 may detect problems arising from interfaces between wafer 304 and e-chuck 306 during inspection and make adjustments to resolve the problems in real-time. Controller 322 may further report any errors occurred during the inspection to an external system.

Figure 4A:
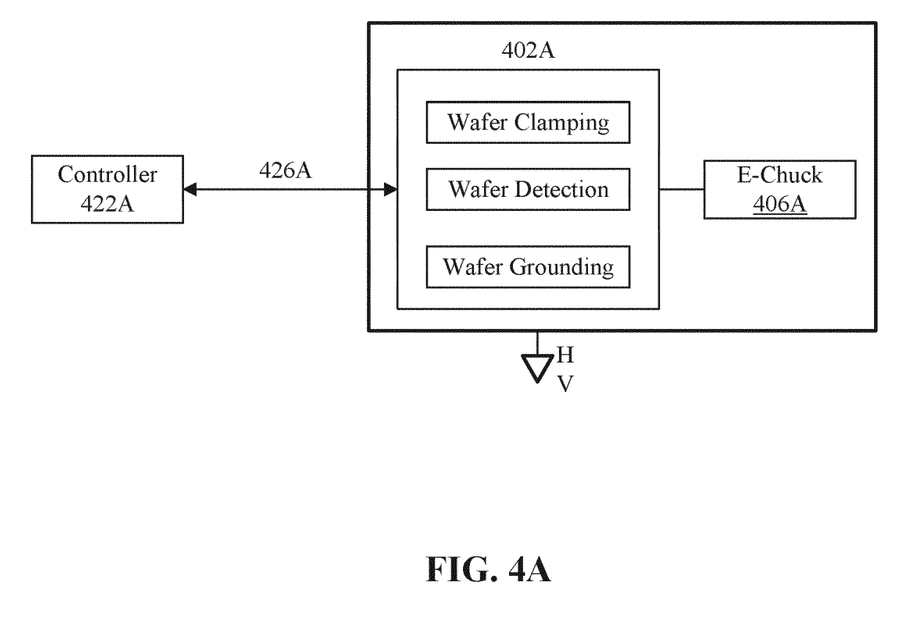
FIG. 4A is a schematic diagram illustrating an embodiment of the exemplary system in FIG. 3, consistent with embodiments of the present disclosure.

FIG. 4A is a schematic diagram illustrating an embodiment of the exemplary system in FIG. 3, consistent with embodiments of the present disclosure. System 400A in FIG.

4A may include e-chuck control system 402A, e-chuck 406A, controller 422A, and bus 426A connecting e-chuck control system 402A and controller 422A. E-chuck control system 402A, e-chuck 406A, and controller 422A may function similar to e-chuck control system 302, e-chuck 306, and controller 322 in FIG. 3, respectively. As shown in FIG. 4A, a high-voltage supplier may provide voltage(s) to e-chuck control system 402A and e-chuck 406A while controller 422A may not receive such voltage(s) from the high-voltage supplier. In some cases, bus 426A can be an optical fiber and can be configured to transfer data between e-chuck control system 402A and controller 422A. When controller 422A is on low voltage while e-chuck control system 402A is on high voltage, the optical fiber can be used to isolate both circuits implemented in e-chuck control system 402A and controller 422A. The voltage provided to e-chuck control system 402A and e-chuck 406A can be the same or different from a voltage applied on a wafer (e.g., wafer 304 in FIG. 3). E-chuck control system 402A may adjust voltage(s) provided to e-chuck based on communication received from controller 422A. As explained above, controller 422A may instruct e-chuck control system 402A (e.g., via driver 330 in FIG. 3) to increase a clamping voltage based on received measurements from a sensor (e.g., sensor 340 or sensor 350 in FIG. 3) by transmitting signals to e-chuck control system 402A to enable e-chuck control system 402A to make adjustments. For example, the provided voltage(s) can be range from 0 kV to 30 kV. Moreover, the high voltage(s) provided to e-chuck 406A may keep a voltage difference between a wafer and e-chuck 406A low (e.g., 1 kV) which can facilitate, and in some cases enable, avoidance of the wafer bowing.

Figure 4B:
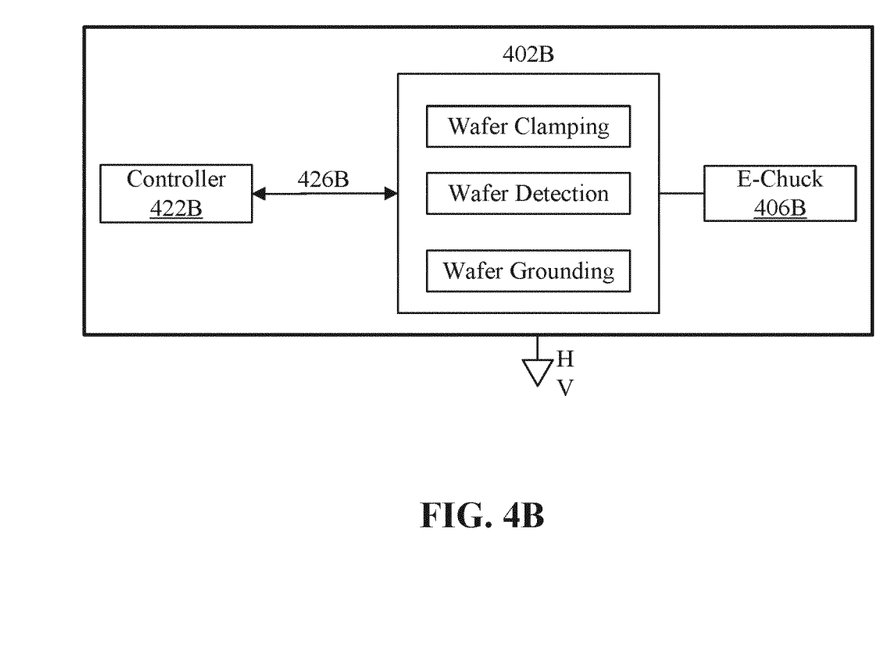
FIG. 4B is a schematic diagram illustrating another embodiment of the exemplary system in FIG. 3, consistent with embodiments of the present disclosure.

FIG. 4B is a schematic diagram illustrating another embodiment of the exemplary system in FIG. 3, consistent with embodiments of the present disclosure. System 400B in FIG. 4B may include e-chuck control system 402B, e-chuck 406B, controller 422B, and bus 426B connecting e-chuck control system 402B and controller 422B. E-chuck control system 402B, e-chuck 406B, and controller 422B may function similar to e-chuck control system 402A, e-chuck 406A, and controller 422A in FIG. 4A, respectively. As shown in FIG. 4B, a high-voltage supplier may provide voltage(s) to e-chuck control system 402A, e-chuck 406A, and controller 422A. In some embodiments, bus 426A may be an optical fiber and can be configured to transfer data between e-chuck control system 402A and controller 422A. In some embodiments, bus 426A may be a communication component other than optical fiber and can be configured to transfer data between e-chuck control system 402A and controller 422A.

Figure 5:
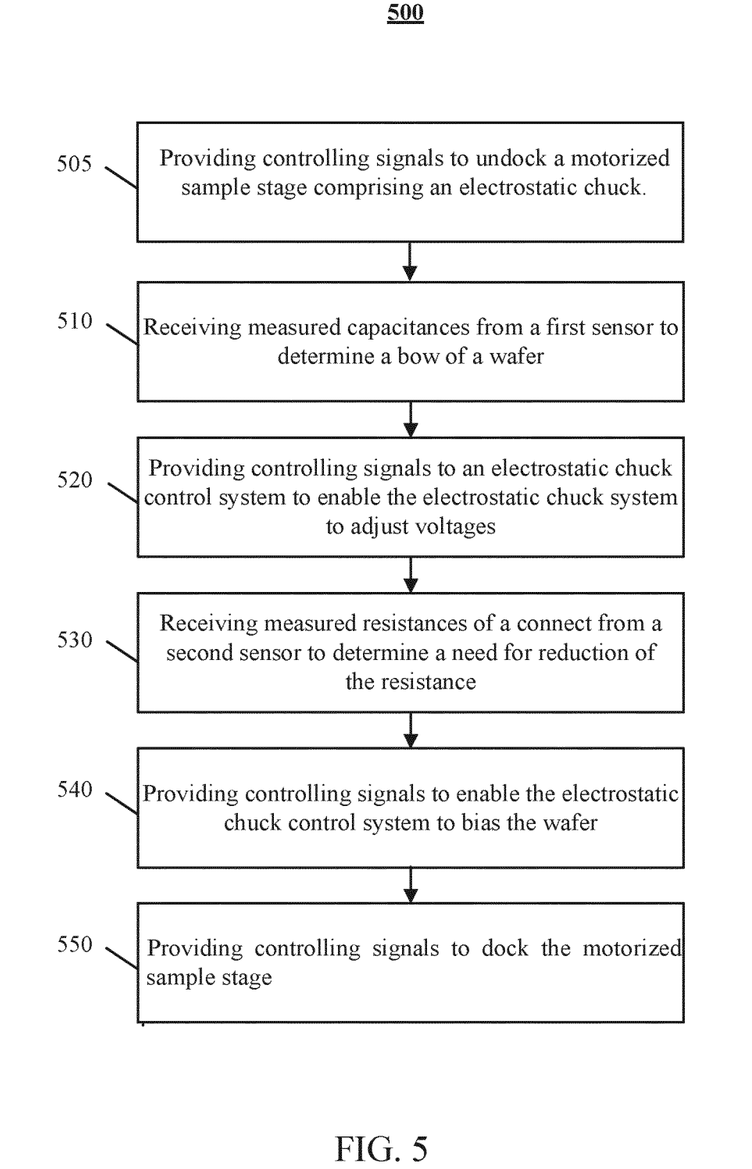
FIG. 5 is a flowchart illustrating an exemplary method for dynamically adjusting parameters of an electrostatic chuck control system for a wafer inspection, consistent with embodiments of the present disclosure.

FIG. 5 is a flowchart illustrating an example method 500 for dynamically adjusting parameters of an electrostatic chuck (e-chuck) control system for a wafer inspection, consistent with embodiments of the present disclosure. Method 500 may be performed by a controller that may be coupled with a charged particle beam apparatus (e.g., EBI system 100). For example, the controller may be controller 109 in FIG. 2, controller 322 in FIG. 3, controller 422A in FIG. 4A, or controller 422B in FIG. 4B. The controller may be programmed to implement method 500.

In step 505, the controller (e.g., controller 109 in FIG. 2) may provide controlling signal(s) to undock a motorized sample stage (e.g., motorized sample stage 201 in FIG. 2) during the wafer inspection. The motorized sample stage may comprise the e-chuck holding the wafer and the e-chuck may comprise a plurality of components configured to influence an interaction between the wafer and the e-chuck during the wafer inspection. For example, the controlling signal(s) may include at least one of a voltage, a current, a profile of the voltage or the current, a frequency of the profile, a period of the profile, a phase of the profile, an amplitude of the profile, or a duration of the voltage or the current and may undock the motorized sample stage to transport the wafer to a main chamber (e.g., main chamber 101 in FIG. 1) to process a wafer inspection process by an electron beam tool (e.g., electron beam tool 104 in FIG. 1). For example, the motorized sample stage can be configured to move to a predetermined coordination to inspect the wafer using an electron beam (e.g., electron beam 220 in FIG. 2). The wafer inspection process may comprise using an electron beam to scan the wafer to inspect the wafer after the wafer is placed at the predetermined coordinate. In some prior art systems, undocking the stage disconnects the stage from the high voltage power supply. Advantageously, for the currently disclosed embodiments, undocking the stage does not disconnect the stage from the high voltage power supply In step 510, the controller may receive first data that indicates a capacitance, the capacitance being between, e.g., one or more of a plurality of electrodes implemented in an electrostatic chuck (E-chuck) and a wafer from a first sensor (e.g., sensor 340 in FIG. 3). The first data may be analyzed to determine a bow of the wafer. For example, the controller may determine that the wafer is tending to release from the e-chuck based on received capacitance measurements from a capacitance measurement sensor (e.g., sensor 340 in FIG. 3) by comparing the received capacitance measurements against predefined capacitance measurements. As another example, the controller may determine that the wafer is tending to release from the e-chuck based on data received that indicates the current flowing through one or more pins or electrodes (e.g., electrodes 310A-B, 311A-B, pins 312A-B, 313) and may determine that the wafer is tending to release from the e-chuck based on the received data.

In step 520, the controller may provide controlling signals to an e-chuck control system (e.g., e-chuck control system 302 in FIG. 3) to enable the e-chuck control system to adjust voltage(s) applied to electrodes implemented in the e-chuck based the first data, which may indicate that the wafer is bowed. For example, the controlling signals may include at least one of a voltage, a current, a profile of the voltage or the current, a frequency of the profile, a period of the profile, a phase of the profile, an amplitude of the profile, or a duration of the voltage or the current and may enable the e-chuck control system to adjust voltage(s) provided to the electrodes. The adjusted voltage(s) may attract and secure the wafer on the chuck, and remove the bow in the wafer (e.g., by compensating the wafer via electrodes 310 and 311). For example, positively charged electrodes in the E-chuck may attract a negatively charged wafer, and negatively charged electrodes in the e-chuck may attract a positively charged wafer.

In step 530, the controller may receive measured resistance of a connection between the wafer and the e-chuck from a second sensor to determine whether a connection to the wafer is sufficiently low resistance, which may enable the wafer to be sufficiently well grounded. For example, a grounding resistance measurement sensor (e.g., sensor 350 in FIG. 3) may measure a voltage between two pins (e.g., pins 312A and 312B, 313 and 312A, 313 and 312B, etc. in FIG. 3) and transfer the measured voltage to the controller. After receiving the measured voltage, the controller may compare the received voltage against a predefined voltage to determine a need for reduction of the resistance, which may enable an improved grounding of the wafer.

In step 540, the controller may provide controlling signal(s) to the e-chuck control system to enable the e-chuck control system to bias the wafer to a predefined voltage level. For example, the controlling signal(s) may include at least one of a voltage, a current, a profile of the voltage or the current, a frequency of the profile, a period of the profile, a phase of the profile, an amplitude of the profile, or a duration of the voltage or the current and may enable the e-chuck control system to configure a sharp pin (e.g., pin 313 in FIG. 3) to break through a protective coating of the wafer and to bias the wafer to a predefined voltage level. When the electron beam interacts with the wafer, the electron beam may charge the wafer and make the wafer no longer electrically neutral. The charged wafer may obtain a voltage and affect the exiting electrons, which may affect the imaging quality. Accordingly, to improve imaging, it may be advantageous to ensure that the wafer is appropriately grounded.

In step 550, the controller (e.g., controller 109 in FIG. 2) may provide controlling signal(s) to dock the motorized sample stage. For example, the controlling signal(s) may include at least one of a voltage, a current, a profile of the voltage or the current, a frequency of the profile, a period of the profile, a phase of the profile, an amplitude of the profile, or a duration of the voltage or the current and may dock the motorized sample stage to transport the wafer to a load/lock chamber (e.g., load/lock chamber 102 in FIG. 1) after the wafer inspection process.

Aspects of the present disclosure are set out in the following numbered clauses:

1. An electrostatic chuck control system configured to be utilized during an inspection process of a wafer, the electrostatic chuck control system comprising:
    an electrostatic chuck of a stage configured to be undocked during the inspection process, wherein the electrostatic chuck comprises a plurality of components configured to influence an interaction between the wafer and the electrostatic chuck during the inspection process;
    a first sensor configured to generate measurement data between at least some of the plurality of components and the wafer; and
    a controller including circuitry configured to receive the measurement data to determine characteristics of the wafer relative to the electrostatic chuck and to generate adjustment data to enable adjusting, while the stage is undocked, at least some of the plurality of components based on the determined characteristics.
2. The electrostatic chuck control system of clause 1, further comprising a driver communicatively coupled to the controller and configured to apply control signals to the plurality of components to enable adjusting the plurality of components.
3. The electrostatic chuck control system of clause 1 or 2, wherein the stage is configured to be moved to a predetermined location during the inspection process after the stage is undocked.
4. The electrostatic chuck control system of clauses 3, wherein the stage is configured to be moved to the predetermined location to enable a charged particle system to scan the wafer during the inspection process.
5. The electrostatic chuck control system of any of clauses 2-4, further comprising a power supply providing power to the driver and the controller.
6. The electrostatic chuck control system of any of clauses 2-5, further comprising an optical fiber connecting the driver and the controller and configured to transfer data between the driver and the controller.
7. The electrostatic chuck control system of any of clauses 1-6, wherein the controller comprises a real-time controller.
8. The electrostatic chuck control system of any clauses 1-7, wherein the plurality of components includes a plurality of electrodes configured to influence the interaction between the wafer and the electrostatic chuck by producing an electric field.
9. The electrostatic chuck control system of clause 8, wherein the measurement data generated by the first sensor comprises a capacitance measurement data between the plurality of electrodes and the wafer.
10. The electrostatic chuck control system of clause 8 or 9, wherein the plurality of electrodes comprises a first set of electrodes and a second set of electrodes, wherein the first and second sets of electrodes are configured to provide data to determine whether the wafer is bowed during the inspection process.
11. The electrostatic chuck control system of any clauses 1-10, wherein the plurality of components includes a plurality of pins configured to influence the interaction between the wafer and the electrostatic chuck by transmitting pulses to the wafer.
12. The electrostatic chuck control system of clause 11, further comprising:
    a second sensor configured to generate resistance measurement data corresponding to resistances of connections between the plurality of pins and the wafer, wherein the controller is further configured to receive the resistance measurement data to determine whether to generate adjustment data for adjusting the resistances of the connections.
13. The electrostatic chuck control system of clause 11 or 12, further comprising a grounding pulse generator configured to generate the pulses to the wafer and to receive adjustment data from the controller to enable adjusting at least some of the plurality of pins based on the determination,
    wherein the pulses are high voltage pulses.
14. The electrostatic chuck control system of any of clauses 1-13, wherein the controller is further configured to report an error to an external system based on the received measurements.
15. A method for dynamically adjusting parameters of an electrostatic chuck control system during an inspection process of a wafer, the method comprising:
    receiving measurement data, after a stage comprising an electrostatic chuck is undocked for the inspection process, that is generated based on interactions between the wafer and a plurality of components implemented in the electrostatic chuck;
    determining, based on the measurement data, characteristics of the wafer relative to the electrostatic chuck; and
    transmitting, based on the determination, signals to enable adjusting at least some of the plurality of components while the stage is undocked.
16. The method of clause 15, further comprising:
    receiving resistance measurement data to determine whether to generate adjustment data for adjusting resistances of connections; wherein the resistance measurement data is generated by a second sensor configured to generate resistance measurement data corresponding to the resistances of connections between the plurality of components and the wafer; and enabling the at least some of the plurality of components based on the determination.

17. A non-transitory computer-readable medium storing a set of instructions that are executable by a controller of an apparatus to cause the apparatus to perform a method to dynamically adjust parameters of an electrostatic chuck control system while a stage coupled to an electrostatic chuck is undocked, the method comprising:

receiving measurement data, while the stage is undocked for wafer inspection, to determine characteristics of the wafer relative to the electrostatic chuck, wherein the measurement data is generated based on interactions between a plurality of first components implemented in the electrostatic chuck and the wafer; and adjusting, while the stage is undocked, at least some of the plurality of first components based on the determined characteristics.

18. The non-transitory computer-readable medium of clause 17, wherein the set of instructions that are executable by the controller of the apparatus to cause the apparatus to further perform:

receiving resistance measurement data to determine whether to generate adjustment data for adjusting resistances of connections between a plurality of second components and the wafer, wherein the resistance measurement data is generated based on interactions between the plurality of second components and the wafer; and adjusting at least some of the plurality of second components based on the determination whether to generate the adjustment data.

19. A method comprising:

undocking a stage comprising an electrostatic chuck to enable an inspection process of a wafer;

generating measurement data based on interactions between the wafer and a plurality of first components implemented at the electrostatic chuck;

determining, based on the generated measurement data, characteristics of the wafer relative to the electrostatic chuck; and providing, to the electrostatic chuck control system, based on the determined characteristics, and by the controller, first signals to enable adjusting at least some of the plurality of first components while the stage is undocked.

20. The method of clause 19, wherein the characteristics of the wafer relative to the electrostatic chuck comprises a bow of the wafer.

21. The method of any of clauses 19 or 20, wherein the plurality of first components include a plurality of electrodes that produce an electric field to adjust the interaction between the wafer and the electrostatic chuck.

22. The method of any of clauses 19-21, wherein the undocking the stage comprises moving the stage to a predetermined coordination to inspect the wafer using an electron beam.

23. The method of any of clauses 19-22, further comprising:

generating resistance measurement data based on resistances of connections between a plurality of second components and the wafer;

determining whether to generate adjustment data for adjusting resistances of connections based on the generated resistance measurement data; and based on the determination, providing second signals to enable adjusting at least some of the plurality of second components while the stage is undocked.

24. The method of clause 23, wherein providing second signals to enable adjusting at least some of the plurality of second components further comprises enabling a grounding pulse generator to generate pulses to the wafer via a first component of the plurality of second components, the first component being a pin configured to influence the interaction between the wafer and the electrostatic chuck.

25. The method of any of clauses 19 or 24, further comprising providing a power from a power supply to a system configured to control the electrostatic chuck during the inspection process of the wafer.

26. The method of any of clauses 19 or 25, further comprising docking the stage after the inspection process.

27. A system configured to inspect a wafer, comprising:

an inspection system configured to manipulate an electron beam for scanning the wafer during an inspection process;

a stage configured to be undocked during the inspection process;

an electrostatic chuck coupled to the stage, wherein the electrostatic chuck comprises a plurality of components configured to influence an interaction between the wafer and the electrostatic chuck during the inspection process;

a first sensor configured to generate measurement data between at least some of the plurality of components and the wafer; and a controller including circuitry configured to receive the measurement data to determine characteristics of the wafer relative to the electrostatic chuck and to generate adjustment data to enable adjusting, while the stage undocked, at least some of the plurality of components based on the determined characteristics.

28. The system of clause 27, further comprising:

a second sensor configured to generate resistance measurement data corresponding to resistances of connections between at least some of the plurality of components and the wafer, wherein the controller is further configured to receive the resistance measurement data to determine whether to generate adjustment data for adjusting the resistances of the connections.

29. A method comprising:

while a stage comprising an electrostatic chuck is undocked, providing power to control the electrostatic chuck during an inspection process of a wafer;

generating measurement data based on interactions between the wafer and a plurality of first components implemented in the electrostatic chuck;

determining, by the controller, characteristics of the wafer relative to the electrostatic chuck based on the generated measurement data;

providing, based on the determined characteristics, first signals to enable adjusting at least some of the plurality of first components;

adjusting, based on the provided first signals, the at least some of the plurality of first components;

reducing the power after the adjustment; and continuing to adjust, while the stage is undocked, at least some of the plurality of first components.

30. The method of clauses 29, further comprising:
generating resistance measurement data based on resistances of connections between a plurality of second components and the wafer;
determining whether to generate adjustment data for adjusting resistances of connections based on the generated resistance measurement data;
based on the determined characteristics, providing second signals to enable adjusting at least some of the plurality of second components; and
adjusting, based on the provided second signals, at least some of the plurality of second components while the stage is undocked.

31. The method of any of clauses 29 or 30, wherein after the stage is undocked, the stage is moved to a predetermined location to enable inspection of the wafer using an electron beam.

A non-transitory computer readable medium may be provided that stores instructions for a processor (for example, processor of controller 109 of FIG. 1, of controller 322 of FIG. 3, of controller 422A of FIG. 4A, or controller 422B of FIG. 4B) to carry out dynamically adjusting parameters of an electrostatic chuck control system for a wafer inspection, image processing, data processing, database management, graphical display, operations of a charged particle beam apparatus, or another imaging device, controlling wafer grounding, controlling wafer grounding location adjustment, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures illustrate the architecture, functionality, and operation of possible implementations of systems, methods, and computer hardware or software products according to various example embodiments of the present disclosure. In this regard, each block in a flowchart or block diagram may represent a module, segment, or portion of code, which includes one or more executable instructions for implementing the specified logical functions. It should be understood that in some alternative implementations, functions indicated in a block may occur out of order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

The invention claimed is:

1. An electrostatic chuck control system configured to be utilized during an inspection process of a wafer, the electrostatic chuck control system comprising:

an electrostatic chuck of a stage configured to be undocked during the inspection process, wherein the electrostatic chuck comprises a plurality of components configured to influence an interaction between the wafer and the electrostatic chuck during the inspection process;
a first sensor configured to generate measurement data between at least some of the plurality of components and the wafer; and
a controller including circuitry configured to receive the measurement data to determine characteristics of the wafer relative to the electrostatic chuck and to generate adjustment data to enable adjusting, while the stage is undocked, at least some of the plurality of components based on the determined characteristics.

2. The electrostatic chuck control system of claim 1, further comprising a driver communicatively coupled to the controller and configured to apply control signals to the plurality of components to enable adjusting the plurality of components.

3. The electrostatic chuck control system of claim 1, wherein the stage is configured to be moved to a predetermined location during the inspection process after the stage is undocked.

4. The electrostatic chuck control system of claim 3, wherein the stage is configured to be moved to the predetermined location to enable a charged particle system to scan the wafer during the inspection process.

5. The electrostatic chuck control system of claim 2, further comprising a power supply providing power to the driver and the controller.

6. The electrostatic chuck control system of claim 2, further comprising an optical fiber connecting the driver and the controller and configured to transfer data between the driver and the controller.

7. The electrostatic chuck control system of claim 1, wherein the controller comprises a real-time controller.

8. The electrostatic chuck control system of claim 1, wherein the plurality of components includes a plurality of electrodes configured to influence the interaction between the wafer and the electrostatic chuck by producing an electric field.

9. The electrostatic chuck control system of claim 8, wherein the measurement data generated by the first sensor comprises a capacitance measurement data between the plurality of electrodes and the wafer.

10. The electrostatic chuck control system of claim 8, wherein the plurality of electrodes comprises a first set of electrodes and a second set of electrodes, wherein the first and second sets of electrodes are configured to provide data to determine whether the wafer is bowed during the inspection process.

11. The electrostatic chuck control system of claim 1, wherein the plurality of components includes a plurality of pins configured to influence the interaction between the wafer and the electrostatic chuck by transmitting pulses to the wafer.

12. The electrostatic chuck control system of claim 11, further comprising: a second sensor configured to generate resistance measurement data corresponding to resistances of connections between the plurality of pins and the wafer, wherein the controller is further configured to receive the resistance measurement data to determine whether to generate adjustment data for adjusting the resistances of the connections.

13. The electrostatic chuck control system of claim 11, further comprising a grounding pulse generator configured to generate the pulses to the wafer and to receive adjustment data from the controller to enable adjusting at least some of the plurality of pins based on the determination, wherein the pulses are high voltage pulses.

14. The electrostatic chuck control system of claim 1, wherein the controller is further configured to report an error to an external system based on the received measurements.

15. A non-transitory computer-readable medium storing a set of instructions that are executable by a controller of an apparatus to cause the apparatus to perform a method to dynamically adjust parameters of an electrostatic chuck control system while a stage coupled to an electrostatic chuck is undocked, the method comprising:

receiving measurement data, while the stage is undocked for wafer inspection, to determine characteristics of the wafer relative to the electrostatic chuck, wherein the measurement data is generated based on interactions between a plurality of first components implemented in the electrostatic chuck and the wafer; and adjusting, while the stage is undocked, at least some of the plurality of first components based on the determined characteristics.

16. The non-transitory computer-readable medium of claim 15, wherein the set of instructions that are executable by the controller of the apparatus to cause the apparatus to further perform:

receiving resistance measurement data to determine whether to generate adjustment data for adjusting resistances of connections between a plurality of second components and the wafer, wherein the resistance measurement data is generated based on interactions between the plurality of second components and the wafer; and adjusting at least some of the plurality of second components based on the determination whether to generate the adjustment data.

17. A method comprising:

undocking a stage comprising an electrostatic chuck to enable an inspection process of a wafer;

generating measurement data based on interactions between the wafer and a plurality of first components implemented at the electrostatic chuck;

determining, based on the generated measurement data, characteristics of the wafer relative to the electrostatic chuck; and providing, to an electrostatic chuck control system, based on the determined characteristics, and by a controller, first signals to enable adjusting at least some of the plurality of first components while the stage is undocked.

18. The method of claim 17, wherein the characteristics of the wafer relative to the electrostatic chuck comprises a bow of the wafer.

19. The method of claim 17, wherein the plurality of first components include a plurality of electrodes that produce an electric field to adjust the interaction between the wafer and the electrostatic chuck.

20. The method of claim 17, wherein the undocking the stage comprises moving the stage to a predetermined coordination to inspect the wafer using an electron beam.

* * * * *